United States Patent
Bickford et al.

(10) Patent No.: US 7,560,946 B2
(45) Date of Patent: Jul. 14, 2009

(54) METHOD OF ACCEPTANCE FOR SEMICONDUCTOR DEVICES

(75) Inventors: Jeanne Paulette Spence Bickford, Essex Junction, VT (US); John R. Goss, South Burlington, VT (US); Nazmul Habib, South Burlington, VT (US); Robert McMahon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 11/837,011

(22) Filed: Aug. 10, 2007

(65) Prior Publication Data

US 2009/0039912 A1 Feb. 12, 2009

(51) Int. Cl.
*G01R 31/28* (2006.01)
*H01L 21/66* (2006.01)
*G06F 19/00* (2006.01)
*G06F 17/50* (2006.01)

(52) U.S. Cl. .......... 324/763; 438/14; 700/121; 716/4

(58) Field of Classification Search .......... 324/763, 324/765, 158.1; 438/14, 18; 700/110, 121; 702/81, 84; 716/4, 5
See application file for complete search history.

(56) References Cited

U.S. PATENT DOCUMENTS

| | | | |
|---|---|---|---|
| 6,031,200 A | 2/2000 | Whitehouse | |
| 6,140,832 A | 10/2000 | Vu et al. | |
| 6,150,669 A | 11/2000 | Nandakumar et al. | |
| 6,477,685 B1* | 11/2002 | Lovelace | 716/4 |
| 6,720,194 B1* | 4/2004 | Miller et al. | 438/14 |
| 6,807,655 B1 | 10/2004 | Rehani et al. | |
| 6,885,955 B1 | 4/2005 | Atchison | |
| 6,965,895 B2 | 11/2005 | Smith et al. | |
| 7,220,990 B2* | 5/2007 | Aghababazadeh et al. | 257/48 |
| 7,382,149 B2* | 6/2008 | Anand et al. | 324/769 |
| 2005/0010546 A1 | 1/2005 | Nowotny et al. | |

OTHER PUBLICATIONS

Bickford et al, "Parametric-based Semiconductor Design", U.S. Appl. No. 11/611,623, filed Dec. 15, 2006.
U.S. Appl. No. 11/459,367, filed Jul. 24, 2006.

* cited by examiner

*Primary Examiner*—Ernest F Karlsen
(74) *Attorney, Agent, or Firm*—Wood, Herron & Evans LLP

(57) ABSTRACT

A method of accepting semiconductor chips is provided using on-chip parametric measurements. An on-chip parametric measurement structure is determined for each parameter in a set of parametric acceptance criteria. An on-chip parametric measurement macro is included in a design of each semiconductor chip for each identified on-chip parametric measurement structure. Each on-chip parametric measurement macro is tested to determine compliance of the semiconductor chip to the set of parametric acceptance criteria. Compliance to the set of parametric acceptance criteria is validated.

7 Claims, 2 Drawing Sheets

METHOD OF ACCEPTANCE FOR SEMICONDUCTOR DEVICES

FIELD OF THE INVENTION

The present invention relates to screening of integrated circuit devices during semiconductor manufacturing, and more particularly to methodology using on-chip parametric measurements to determine compliance to acceptance criteria.

BACKGROUND OF THE INVENTION

Semiconductor wafer fabrication involves a series of processes used to create semiconductor devices and integrated circuits in and on a semiconductor wafer surface. Fabrication typically involves the basic operations of layering and patterning, together with other operations such as doping and heat treatments. Layering is an operation generally used to add thick layers of material to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

The semiconductor devices and integrated circuits are fabricated on areas of the semiconductor wafer in repeating patterns. The individual patterns, containing the desired semiconductor devices and integrated circuits, are then separated or singulated into individual semiconductor chips, each chip possessing the desired design. The number of semiconductor chips obtained from a single semiconductor wafer is a function of the size of the starting wafer, as well as the size of the individual semiconductor chip. The separation into individual semiconductor chips is usually accomplished by cutting or scribing the semiconductor wafer, in designated regions of the wafer, located between the repeating device patterns, via use of mechanical or laser apparatus. The regions, designated as areas to be used for scribing, are usually referred to as scribe lines, or kerf regions. Since the separation into individual semiconductor chips occurs only at the completion of device fabrication process, the scribe line areas can be used for test sites or end point detection sites, needed for evaluation of the health of the ongoing semiconductor wafer. However, using scribe lines for testing presents challenges to a semiconductor manufacturing facility, also known as a foundry, for product debugging and validation.

Methods for determining compliance of chips from the foundry are important for both the foundry and chip designers in accepting lots of chips produced by the foundry for a particular set of design rules. Customers of the computer chips are generally their own chip designers providing the foundry with graphical data representing the design rules for the chips to be created on a semiconducting wafer. The foundry is then responsible for creating the chips on the semiconducting wafers to meet a set of requirements provided by the chip designers. Conventional methods using scribe line measurements to determine compliance with the design criteria serve as a basis of acceptance for the manufacturing process at the wafer test level. Since in-line testing is time consuming and expensive, it is important to perform adequate testing within a minimal amount of time. Generally, testing is done by sampling a set of scribe lines to obtain an overall health of line ('HOL') measurement. For customized circuits, testing by sampling may not provide an accurate assessment of device parameters with in each die (portion of the wafer containing an entire integrated circuit or collection of integrated circuits that have not been packaged) of the wafer. An accurate assessment is critical for improving yield and ensuring that customer requirements and delivery expectations are met.

Difficulties exist when using scribe line measurements, as the scribe lines are not within the actual chip boundary. Scribe line measurements can be affected by surrounding devices and may provide measurements that meet the requirements of the customer specification, while the actual device may not be in compliance. Another challenge with the use of scribe lines is that the scribe lines no longer exist after the wafers are diced. If a customer determines that there is a problem at the device level, there may be uncertainty as to where the problem originated and it can take up to approximately four to six weeks to repeat an experiment. Even with a repeat of the experiment, there may still be no definite way to determine if the problem was due to a manufacturing error, was a transient problem that no longer exists, or is a problem in the design of the chip from the customer.

SUMMARY OF THE INVENTION

Embodiments of the invention provide methods of accepting semiconductor chips using on-chip parametric measurements. An on-chip parametric measurement structure is determined for each parameter in a set of parametric acceptance criteria. An on-chip parametric measurement macro is included in a design of each semiconductor chip for each identified on-chip parametric measurement structure. Each on-chip parametric measurement macro is tested to determine compliance of the semiconductor chip to the set of parametric acceptance criteria, and the compliance to the set of parametric acceptance criteria is validated. In one embodiment, the set of parametric acceptance criteria is established by identifying a set parametric acceptance criteria for each semiconductor chip, and documenting the identified set of parametric acceptance criteria.

In some embodiments, the on-chip parametric measurement macro includes a scaling parametric measurement (SPM) macro in the design of the semiconductor chip for each identified on-chip parametric measurement structure. Each on-chip parametric measurement macro is tested to determine compliance of the semiconductor chip to the set of parametric acceptance criteria may be performed in a wafer-level test, or in other embodiments, in a module-level test. In some embodiments, a designer of the semiconductor chip performs the validation of the compliance with the set of parametric acceptance criteria. The on-chip parametric measurement macros may also be used in some embodiments to debug design issues.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Embodiments of the invention provide methods for acceptance of semiconductor wafers or modules using on-chip parametric measurements. Many of the challenges of using scribe line measurements may be avoided by using the on-chip measurements for validation. The method utilizes integrated circuits that allow device level parametric measurements in a manufacturing test environment to determine parametric values in wafer test or module test. A few examples of some typical parametric measurements are $L_{poly}$, device current (off, linear, saturation), threshold voltage, oxide thickness $T_{ox}$, overlap capacitance, junction capacitance, and resistance.

Figure 1:
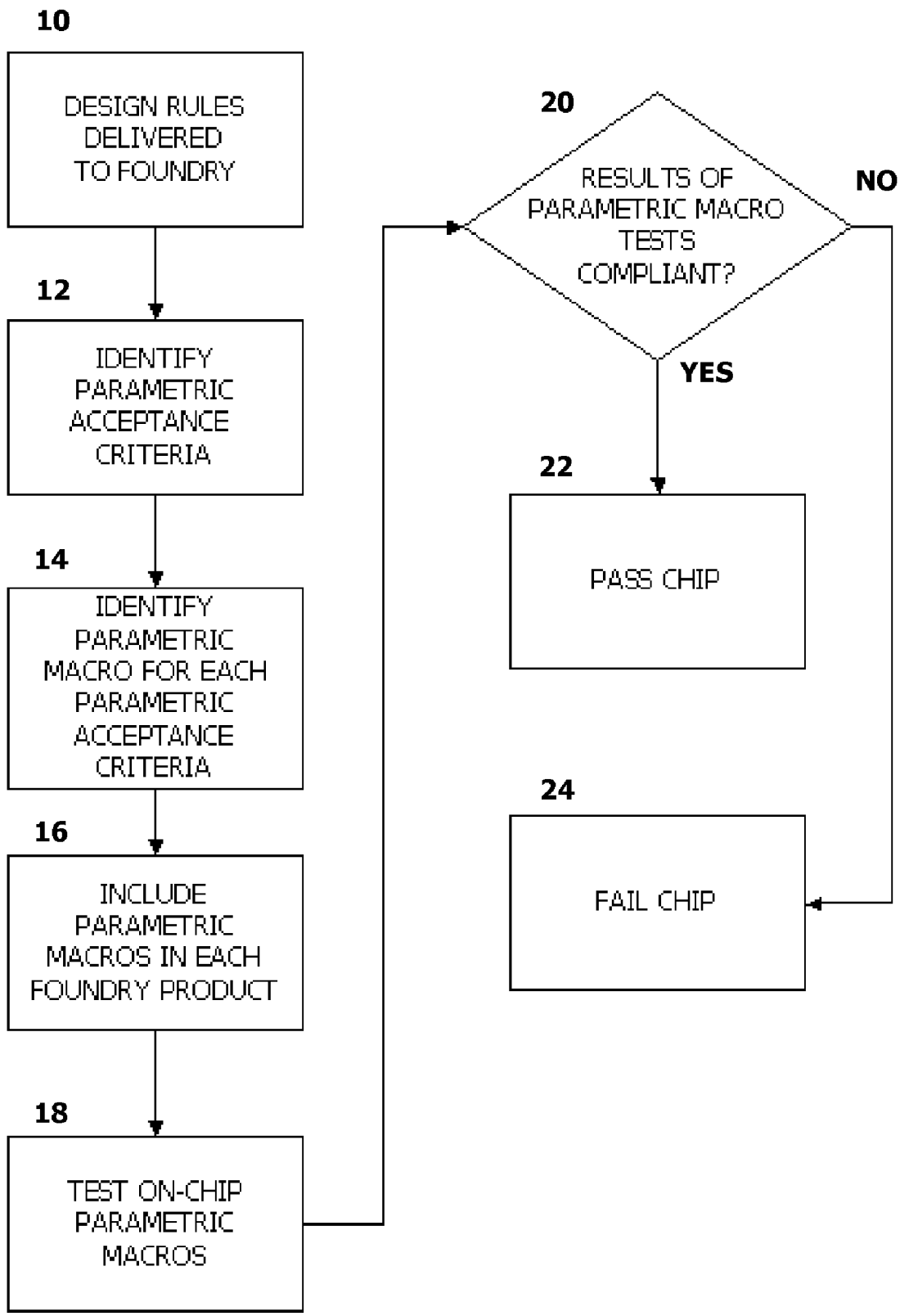
FIG. 1 is a flowchart illustrating the use of on-chip parametric measurements for validating design rule compliance.

Referring now to FIG. 1, a customer of the foundry delivers design rules for a chip design to the foundry in block 10. Chip designs may be supplied in graphical form or other forms that are conventionally practiced in the art. The foundry and customer work together to develop parametric acceptance criteria for the new chip design in block 12. Advantages of developing these criteria together include the ability to use the criteria as a binding agreement between the foundry and the customer in determining which lots of chips are in or out of compliance. The development of acceptance criteria could also be an iterative process where the foundry and customer develop criteria independent of each other and iteratively arrive at a final set of acceptance criteria. Other methods for setting acceptance criteria may also be used, such as the customer supplying the acceptance criteria along with the design to the foundry.

Once the parametric acceptance criteria have been established, a parametric macro is developed for each of the parameters in the acceptance criteria in block 14. Parametric macros are one method for measuring the parameters in the acceptance criteria to determine compliance with the criteria; however, other methods may also be used. The parametric macros are included at the chip level in each of the foundry products produced by the client designs in block 16. Incorporating the parametric macros at the chip level allows for compliance testing at the wafer-level as with scribe lines, as well as at the module-level and even higher levels of assembly. Wafer-level testing is performed on chips before the individual chips, each containing an integrated circuit, are singulated from the semiconductor wafer and packaged in a module. The module may include one or more individual chips, each containing an integrated circuit. By packaging only those chips that have passed wafer-level testing, unnecessary packaging operations and/or rework of packaging operations may be avoided. Equipment and procedures used in either wafer-level testing or module-level testing are understood by a person having ordinary skill in the art and provides both the foundry and customer the ability to perform compliance testing even after the wafer has been diced, thus reducing the need to repeat the manufacturing and testing process when parameters are out of compliance.

During the manufacturing process the parametric macros test the parameters of the acceptance criteria in block 18. If the parameters are in compliance with the identified parametric acceptance criteria ("YES" branch of decision block 20), the chips are deemed acceptable in block 22. If, however, the parameters of too many chips are not in compliance with the identified parametric acceptance criteria ("NO" branch of decision block 20), the chips are failed in block 24 and may be scrapped. Tests may be performed by the foundry only, the customer only, or a combination of both the foundry and customer.

In addition to compliance testing, the parametric macros may also assist in mitigating disputes between the foundry and the customer with regard to ensuring that the manufacturing line is producing a product that is in compliance with the design rules for the chip layouts. For example, because the parametric macros are implemented at the chip level, they may be used to test the chips after the wafer has been diced to assist in determining if a nonconforming chip is the result of a manufacturing deviation or a result of a design problem. If it is the latter, the parametric macros may also be used by the chip designers to assist in debugging the problems with the chip design.

In one embodiment of the invention, the on-chip macros are implemented as Scalable Parameter Measurement ('SPM') macros as disclosed in both U.S. patent application Ser. No. 11/459,367, filed on Jul. 24, 2006, and U.S. patent application Ser. No. 11/611,623, filed on Dec. 15, 2006, both of which are assigned to the same assignee as the present invention and are incorporated herein by reference. SPM macros are extremely small circuits or components, requiring no additional pins and using only minimal space on the chip. SPM macros allow for several unique device experiments to be implemented simultaneously on a chip. Experiments are generally implemented as arrays of Field Effect Transistors ('FET'), which have their collective $I_{on}$ measurements averaged, and recorded, along with threshold voltage ($V_{th}$) and effective current ($I_{eff}$) measurements, if applicable. This is done to account for spatial variations. Each experiment is referenced as a Device Under Test ('DUT'). DUTs may consist of nFET and pFET experiments as well as Back End Of Line ('BEOL') experiments. Additionally, by placement of multiple SPM macros on a single chip, across chip variation data can be extracted and analyzed.

Figure 2:
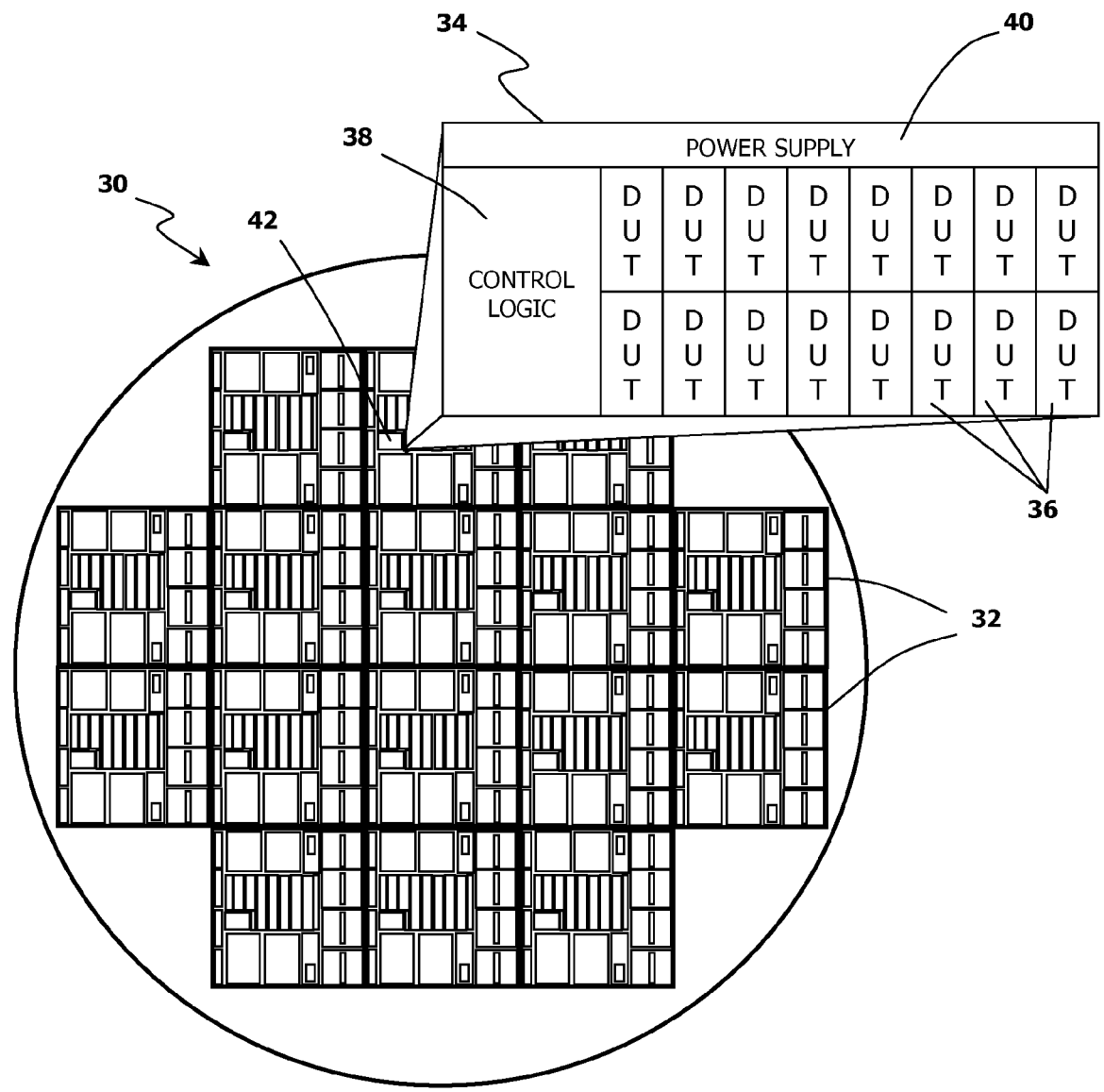
FIG. 2 is an exemplary representation of a semiconductor wafer containing chip designs, detailing a scalable parametric macro used for the on-chip parametric measurements in FIG. 1.

Referring now to FIG. 2, an exemplary representation of a semiconductor wafer 30 contains multiple copies of a chip 32 having a particular design. An SPM macro 34 has been included as part of the fabrication process by the factory and is presented in an expanded block form. The SPM macro 34 for this embodiment contains sixteen test circuits, DUTs 36, which may consist of different tests. The DUTs 36 are controlled by control logic 38 and powered by a power supply 40. The control logic 38 includes a logic controller having a decoder for activating one or more DUT 36 structures, a decode level translator which provides a required logic level or required voltage to one or more DUT 36 structures, and a protection circuit which isolates the integrated circuit when the test system is inactive. SPM macros 34 do not interfere with the operation of the chip 32 and may be placed adjacent to a circuit 42 for testing, which may provide for better accuracy in the measurements of resistance, capacitance, currents and/or voltages used in determining compliance to the design rules. The circuit may operate in either a single or dual supply mode. In the single supply mode, during wafer final test and/or module final test, a current ($I_{on}$) measurement for each DUT 36 is calculated and recorded. In dual supply mode, the circuit controls the voltage to a DUT 36 gate, for example, as well as provides power to the DUT 36 source and/or drain. Measurements for threshold voltage ($V_{th}$), current ($I_{on}$), and effective current ($I_{eff}$) for each DUT 36 are then calculated and recorded. These measurements may then be compared to the acceptance criteria and the semiconductor chip/wafer can then be validated.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicants' general inventive concept.

What is claimed is:

1. A method of accepting semiconductor chips using on-chip parametric measurements, the method comprising:
    determining an on-chip parametric measurement structure for each parameter in a set of parametric acceptance criteria;
    including an on-chip parametric measurement macro in a design of each semiconductor chip for each identified on-chip parametric measurement structure;
    testing each on-chip parametric measurement macro to determine compliance of the semiconductor chip to the set of parametric acceptance criteria; and
    validating the compliance to the set of parametric acceptance criteria.

2. The method of claim 1 wherein the set of parametric acceptance criteria is established by
    identifying parametric acceptance criteria for each semiconductor chip; and
    documenting the identified parametric acceptance criteria.

3. The method of claim 1 wherein including the on-chip parametric measurement macro comprises:
    including a scaling parametric measurement (SPM) macro in the design of the semiconductor chip for each identified on-chip parametric measurement structure.

4. The method of claim 1 wherein testing each on-chip parameter measurement macro comprises:
    testing each on-chip parametric measurement macro to determine compliance of the semiconductor chip to the set of parametric acceptance criteria in a wafer-level test.

5. The method of claim 1 wherein testing each on-chip parameter measurement macro comprises:
    testing each on-chip parametric measurement macro to determine compliance of the semiconductor chip to the set of parametric acceptance criteria in a module-level test.

6. The method of claim 1 wherein validating the compliance is performed by a designer of the semiconductor chip.

7. The method of claim 1 further comprising:
    using the on-chip parametric measurement macros to debug a design issue.

* * * * *